(12) United States Patent
Cavalcante et al.

(10) Patent No.: US 10,848,220 B2
(45) Date of Patent: Nov. 24, 2020

(54) COMPRESSING AND DECOMPRESSING BEAMSPACE COEFFICIENTS (71) Applicant: TELEFONAKTIEBOLAGET LM ERICSSON (PUBL), Stockholm (SE)

(72) Inventors: Andre Mendes Cavalcante, Indaiatuba (BR); Igor Almeida, Indaiatuba (BR); Eduardo Lins De Medeiros, Sundbyberg (SE); Keke Zu, Solna (SE); Miguel Berg, Sollentuna (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 16/478,504

(22) PCT Filed: Mar. 8, 2017

(86) PCT No.: PCT/SE2017/050224
§ 371 (c)(1),
(2) Date: Jul. 17, 2019

(87) PCT Pub. No.: WO2018/164614
PCT Pub. Date: Sep. 13, 2018

(65) Prior Publication Data
US 2019/0393945 A1 Dec. 26, 2019

(51) Int. Cl.
*H04B 7/06* (2006.01)
*H04B 7/0408* (2017.01)

(52) U.S. Cl.
CPC ......... *H04B 7/0617* (2013.01); *H04B 7/0408* (2013.01)

(58) Field of Classification Search
CPC .. H04B 7/0617; H04B 7/0452; H04B 7/0408; H04B 7/0697; H04B 7/088

(Continued)

(56) References Cited

U.S. PATENT DOCUMENTS

| | | | |
|---|---|---|---|
| 6,185,440 B1* | 2/2001 | Barratt | H01Q 1/246 370/334 |
| 7,676,007 B1* | 3/2010 | Choi | H04B 7/0617 375/267 |
| 2004/0071222 A1* | 4/2004 | Liang | H04B 7/0669 375/267 |

(Continued)

OTHER PUBLICATIONS

Alex Stephenne et al., "BF Implementation in DU—Review Meeting for TA OS", Jun. 15, 2016, pp. 1-63.

(Continued)

*Primary Examiner* — Emmanuel Bayard
(74) *Attorney, Agent, or Firm* — Patent Portfolio Builders PLLC (57) ABSTRACT

It is provided a method for compressing beamspace coefficients to be applied when transferring data between a radio network node and a specific user device, the method being performed in a coefficient encoder and comprising the steps of: obtaining beamspace coefficients, wherein each beamspace coefficient comprises a complex value and a direction; determining at least one cluster based on proximity, in a complex plane, of the complex values of the beamspace coefficients; determining, for each beamspace coefficient, a cluster to which it belongs; determining a representative complex value for each one of the at least one cluster; outputting the representative complex values for each cluster; and outputting, for each beamspace coefficient, an identity of the cluster to which the beamspace coefficient belongs.

30 Claims, 7 Drawing Sheets

Clustered Beamspace Coefficients in Beam Space Domain (58) Field of Classification Search
USPC .............................. 375/267, 299, 347–349
See application file for complete search history.

(56) References Cited

U.S. PATENT DOCUMENTS

| | | | |
|---|---|---|---|
| 2005/0129154 A1* | 6/2005 | Olesen | H04B 7/0845 375/347 |
| 2007/0206626 A1* | 9/2007 | Lee | H04B 7/0417 370/437 |
| 2009/0086842 A1 | 4/2009 | Shi et al. | |
| 2012/0071153 A1* | 3/2012 | Balachandran | H04J 11/004 455/422.1 |
| 2016/0014722 A1 | 1/2016 | Yoon et al. | |
| 2016/0365904 A1* | 12/2016 | Sayeed | H04W 64/00 |
| 2018/0123674 A1* | 5/2018 | Freedman | H04B 7/18515 |
| 2018/0146419 A1* | 5/2018 | Raghavan | H04B 7/0695 |
| 2019/0387504 A1* | 12/2019 | Jung | H04W 72/042 |

OTHER PUBLICATIONS

International Search Report and Written Opinion, dated Nov. 8, 2017, from corresponding/related International Application No. PCT/SE2017/050224.

Jinho Choi, "Opportunistic Beamforming With Single Beamforming Matrix for Virtual Antenna Arrays", IEEE Transactions on Vehicular Technology, Mar. 2011, pp. 872-881, vol. 60, No. 3.

Junyoung Nam et al., "Joint Spatial Division and Multiplexing: Opportunistic Beamforming, User Grouping and Simplified Downlink Scheduling", IEEE Journal of Selected Topics in Signal Processing, Oct. 2014, pp. 876-890, vol. 8, No. 5.

Junyoung Nam et al., "User Grouping of Two-Stage MU-MIMO Precoding for Clustered User Geometry", IEEE Communications Letters, Aug. 2015, pp. 1458-1461, vol. 19, No. 8.

Robert M. Gray, "Vector Quantization", IEEE ASSP Magazine, Apr. 1, 1984, pp. 4-29, vol. 1, No. 2.

* cited by examiner

Fig. 10

COMPRESSING AND DECOMPRESSING BEAMSPACE COEFFICIENTS

TECHNICAL FIELD

The invention relates to methods, coefficient encoders, coefficient decoders, computer programs and computer program products for compressing beamspace coefficients to be applied when transferring data between a radio network node and a specific user device.

BACKGROUND

In order to meet the increasing demand for data in next-generation mobile broadband networks (termed 5G systems), innovative and practical deployment solutions are required. Although several potential technologies have been proposed in recent years in relation to 5G, it is recognized that advanced multi-antenna systems are one part for enabling 5G radio access with improved spectral efficiency, better performance, and broader coverage. In this context, massive MIMO (Multiple-Input-Multiple-Output)/Beamforming (BF) arises as one of key concepts from these multi-antenna solutions.

The operations involved in beamforming can be performed in different domains, e.g. element space where there is a complex weight for each antenna element, or beamspace where there is a complex weight for each direction or beam. Element space and beamspace are related through some kind of spatial transform. Often, the Discrete Fourier Transform (DFT) is used but other alternatives are also possible, e.g. using Singular Value Decomposition (SVD). For a linear antenna array, a 1-dimensional transform is sufficient but for a planar array, a 2-dimensional spatial transform is preferred. The DFT gives a fixed grid of beams and is often implemented using the Fast Fourier Transform (FFT) algorithm. SVD can give better performance than DFT but at the cost of higher computational complexity.

5G systems are expected to employ new network interfaces into the Centralized/Cloud Radio Access Network (C-RAN) architecture. Such interfaces support splitting of radio access functionality between a remote unit and a central unit. This architecture directly impacts how the multi-antenna solutions should be deployed. For instance, when beamforming is applied, radio processing is expected to be performed at the remote unit (remote radio hardware) and the beamforming coefficients (controlling each antenna contribution) are exchanged between central unit and remote processing unit over a fronthaul link.

For example, for single layer transmission in the downlink, beamforming coefficients as well as a signal to be transmitted over the air may be transmitted over the fronthaul to the remote unit. For each antenna element, the signal is multiplied by the corresponding beamforming coefficient (in antenna element space) and transmitted on the antenna. The combined transmission from all the antennas results in the signal being transmitted with the desired spatial characteristics, for example as a narrow beam in a particular direction.

As the number of antenna elements could be large and the density of users is expected to be high, the available transmission capacity on the fronthaul link is likely to become a bottleneck. Therefore, substantial fronthaul data compression in beamforming scenarios is of great importance for C-RAN implementations.

In an architecture where beamforming coefficients are calculated in the central unit, beamforming coefficients need to be sent from the central unit to the remote unit. If channel estimation is done in the remote unit, these estimates need to be sent from the remote unit to the central unit as input to the beamforming coefficient calculation.

In an architecture where beamforming coefficients are calculated in the remote unit, they may still be needed in the central unit, in order to improve equalization or channel estimation.

SUMMARY

It is an object to provide an improved way of compressing beamspace coefficients. According to a first aspect, it is provided a method for compressing beamspace coefficients to be applied when transferring data between a radio network node and a specific user device, the method being performed in a coefficient encoder and comprising the steps of: obtaining beamspace coefficients, wherein each beamspace coefficient comprises a complex value and a direction; determining at least one cluster based on proximity, in a complex plane, of the complex values of the beamspace coefficients; determining, for each beamspace coefficient, a cluster to which it belongs; determining a representative complex value for each one of the at least one cluster; outputting the representative complex values for each cluster; and outputting, for each beamspace coefficient, an identity of the cluster to which the beamspace coefficient belongs.

The method may further comprise the steps of: determining at least one beam window, wherein each beam window covers a strict subset of the beamspace coefficients arranged by directions, wherein the at least one beam window is determined based on magnitudes of the beamspace coefficients; determining, for each cluster, whether there are any beamspace coefficients of the cluster having a direction within the at least one beam window, in which case the cluster in question is a windowed cluster; and wherein the step of outputting the representative complex values comprises outputting the representative complex values only for each windowed cluster; and the step of outputting an identity comprises outputting, only for each beamspace coefficient forming part of a windowed cluster, an identity of the cluster to which it belongs.

The step of determining at least one beam window may comprise using a specified window size.

The step of determining at least one beam window may comprise determining a specified number of windows.

The step of determining at least one beam window may comprise fusing any overlapping windows to a fused window.

The step of determining at least one beam window may comprise covering beamspace coefficients of greatest magnitude.

In one embodiment, the step of determining at least one cluster only considers beamspace coefficients within the at least one beam window.

The step of outputting an identity may comprise outputting, only for each beamspace coefficient having a direction within one of the at least one beam window, an identity of the cluster to which the beamspace coefficient belongs.

The step of obtaining the beamspace coefficients may comprise transforming beamforming coefficients to beamspace coefficients using a spatial transform. The spatial transform can e.g. be implemented using Discrete Fourier Transform (DFT) or Singular Value Decomposition (SVD).

The step of determining a representative complex value may comprise determining, for each cluster, the respective representative complex value to be in the centre of the cluster.

The step of determining a representative complex value may comprise determining, for each cluster, the respective representative complex value to be the beamspace coefficient which is closest to the centre of the cluster.

According to a second aspect, it is provided a coefficient encoder for compressing beamspace coefficients to be applied when transferring data between a radio network node and a specific user device. The coefficient encoder comprises: a processor; and a memory storing instructions that, when executed by the processor, cause the coefficient encoder to: obtain beamspace coefficients, wherein each beamspace coefficient comprises a complex value and a direction; determine at least one cluster based on proximity, in a complex plane, of the complex values of the beamspace coefficients; determine, for each beamspace coefficient, a cluster to which it belongs; determine a representative complex value for each one of the at least one cluster; output the representative complex values for each cluster; and output, for each beamspace coefficient, an identity of the cluster to which the beamspace coefficient belongs.

The coefficient encoder may further comprise instructions that, when executed by the processor, cause the coefficient encoder to: determine at least one beam window, wherein each beam window covers a strict subset of the beamspace coefficients arranged by directions, wherein the at least one beam window is determined based on magnitudes of the beamspace coefficients; determine, for each cluster, whether there are any beamspace coefficients of the cluster having a direction within the at least one beam window, in which case the cluster in question is a windowed cluster; and wherein the instructions to output the representative complex values comprise instructions that, when executed by the processor, cause the coefficient encoder to output the representative complex values only for each windowed cluster; and the instructions to output an identity comprise instructions that, when executed by the processor, cause the coefficient encoder to output, only for each beamspace coefficient forming part of a windowed cluster, an identity of the cluster to which it belongs.

The instructions to determine at least one beam window may comprise instructions that, when executed by the processor, cause the coefficient encoder to use a specified window size.

The instructions to determine at least one beam window may comprise instructions that, when executed by the processor, cause the coefficient encoder to determine a specified number of windows.

The instructions to determine at least one beam window may comprise instructions that, when executed by the processor, cause the coefficient encoder to fuse any overlapping windows to a fused window.

The instructions to determine at least one beam window may comprise instructions that, when executed by the processor, cause the coefficient encoder to cover beamspace coefficients of greatest magnitude.

The instructions to determine at least one cluster may comprise instructions that, when executed by the processor, cause the coefficient encoder to only consider beamspace coefficients within the at least one beam window when determining the at least one cluster.

The instructions to output an identity may comprise instructions that, when executed by the processor, cause the coefficient encoder to output, only for each beamspace coefficient having a direction within one of the at least one beam window, an identity of the cluster to which the beamspace coefficient belongs.

The instructions to obtain the beamspace coefficients may comprise instructions that, when executed by the processor, cause the coefficient encoder to transform beamforming coefficients to beamspace coefficients using a spatial transform.

The instructions to determine a representative complex value may comprise instructions that, when executed by the processor, cause the coefficient encoder to determine, for each cluster, the respective representative complex value to be in the centre of the cluster.

The instructions to determine a representative complex value may comprise instructions that, when executed by the processor, cause the coefficient encoder to determine, for each cluster, the respective representative complex value to be the beamspace coefficient which is closest to the centre of the cluster.

According to a third aspect, it is provided a coefficient encoder comprising: means for obtaining beamspace coefficients to be applied when transferring data between a radio network node and a specific user device, wherein each beamspace coefficient comprises a complex value and a direction; means for determining at least one cluster based on proximity, in a complex plane, of the complex values of the beamspace coefficients; means for determining, for each beamspace coefficient, a cluster to which it belongs; means for determining a representative complex value for each one of the at least one cluster; means for outputting the representative complex values for each cluster; and means for outputting, for each beamspace coefficient, an identity of the cluster to which the beamspace coefficient belongs.

According to a fourth aspect, it is provided a computer program for compressing beamspace coefficients to be applied when transferring data between a radio network node and a specific user device. The computer program comprises computer program code which, when run on a coefficient encoder, causes the coefficient encoder, to: obtain beamspace coefficients, wherein each beamspace coefficient comprises a complex value and a direction; determine at least one cluster based on proximity, in a complex plane, of the complex values of the beamspace coefficients; determine, for each beamspace coefficient, a cluster to which it belongs; determine a representative complex value for each one of the at least one cluster; output the representative complex values for each cluster; and output, for each beamspace coefficient, an identity of the cluster to which the beamspace coefficient belongs.

According to a fifth aspect, it is provided a computer program product comprising a computer program according to the fourth aspect and a computer readable means on which the computer program is stored.

According to a sixth aspect, it is provided a method for decompressing beamspace coefficients to be applied when transferring data between a radio network node and a specific user device. The method is performed in a coefficient decoder and comprising the steps of: receiving at least one representative complex value, wherein each representative complex value is associated with a respective cluster; receiving, for each one of a plurality of beamspace coefficients, a direction and an identity of the cluster to which it belongs; and assigning, for each one of the beamspace coefficients, the representative complex value of its respectively associated cluster.

The method may further comprise a step of transforming the beamspace coefficients into antenna element space using an inverse spatial transform.

According to a seventh aspect, it is provided a coefficient decoder for decompressing beamspace coefficients to be applied when transferring data between a radio network node and a specific user device. The coefficient decoder comprises: a processor; and a memory storing instructions that, when executed by the processor, cause the coefficient decoder to: receive at least one representative complex value, wherein each representative complex value is associated with a respective cluster; receive, for each one of a plurality of beamspace coefficients, a direction and an identity of the cluster to which it belongs; and assign, for each one of the beamspace coefficients, the representative complex value of its respectively associated cluster.

The coefficient decoder may further comprise instructions that, when executed by the processor, cause the coefficient decoder to transform the beamspace coefficients into antenna element space using an inverse spatial transform.

According to an eighth aspect, it is provided a coefficient decoder comprising: means for receiving at least one representative complex value, wherein each representative complex value is associated with a respective cluster; means for receiving, for each one of a plurality of beamspace coefficients to be applied when transferring data between a radio network node and a specific user device, a direction and an identity of the cluster to which it belongs; and means for assigning, for each one of the beamspace coefficients, the representative complex value of its respectively associated cluster.

According to a ninth aspect, it is provided a computer program for decompressing beamspace coefficients to be applied when transferring data between a radio network node and a specific user device, the computer program comprising computer program code which, when run on a coefficient decoder causes the coefficient decoder to: receive at least one representative complex value, wherein each representative complex value is associated with a respective cluster; receive, for each one of a plurality of beamspace coefficients, a direction and an identity of the cluster to which it belongs; and assign, for each one of the beamspace coefficients, the representative complex value of its respectively associated cluster.

According to a tenth aspect, it is provided a computer program product comprising a computer program according to the ninth aspect and a computer readable means on which the computer program is stored.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which.

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figure 1:
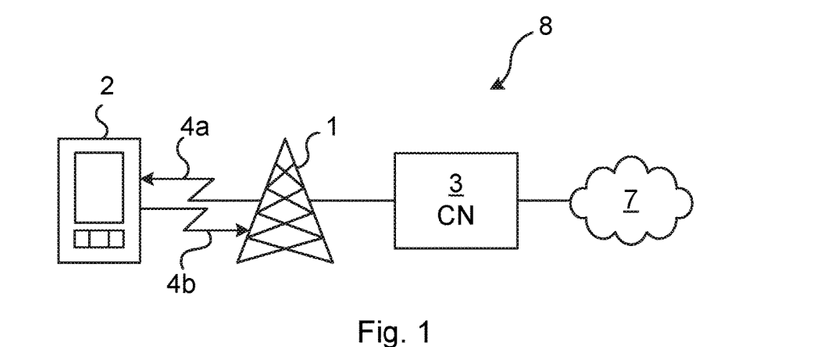
FIG. 1 is a schematic diagram illustrating a cellular communication network where embodiments presented herein may be applied.

FIG. 1 is a schematic diagram illustrating a cellular communication network 8 where embodiments presented herein may be applied. The cellular communication network 8 comprises a core network 3 and one or more radio network nodes 1, here in the form of radio base stations being evolved Node Bs, also known as eNode Bs or eNBs. The radio network node 1 could also be in the form of Node Bs, BTSs (Base Transceiver Stations) and/or BSSs (Base Station Subsystems), etc. The radio network node 1 provides radio connectivity over a wireless interface 4a-b to a plurality of user devices 2.

Over the wireless interface, downlink (DL) communication 4a occurs from the radio network node 1 to the user device 2 and uplink (UL) communication 4b occurs from the user device 2 to the radio network node 1. The quality of the wireless radio interface to each user device 2 can vary over time and depending on the position of the user device 2, due to effects such as fading, multipath propagation, interference, etc.

The radio network node 1 comprises several antennas, e.g. in a MIMO antenna array and can thereby apply beamforming to the user devices 2 by applying beamforming coefficients, respectively for each one of the antennas. The beamforming is applied separately for each user device 2. The beamforming can be applied in downlink 4a and/or uplink 4b.

The beamforming coefficients (applied in an antenna element domain) are weights that are directly applied on the antenna elements for beamforming applications. The beamforming coefficients can be evaluated for optimising one or more criteria, for instance, SINR (Signal to Interference plus Noise Ratio). Beamspace coefficients, in a beamspace domain, are weights which can be derived from the beamforming coefficients (in the antenna element domain), as spatial frequency representations of the beamforming coefficients. Conversion between the antenna element domain and the beamspace domain can be achieved using a spatial transform (e.g. Discrete Fourier Transform (DFT) or Singular Value Decomposition (SVD)) and corresponding inverse spatial transform.

The term user device 2 is also known as mobile communication terminal, user equipment (UE), mobile terminal, user terminal, user agent, wireless device, wireless terminal, machine-to-machine device etc., and can be, for example, what today are commonly known as a mobile phone, smart phone or a tablet/laptop with wireless connectivity.

The cellular communication network 8 may e.g. comply with any one or a combination of 5G NR (New Radio), LTE (Long Term Evolution), LTE-Advanced, W-CDMA (Wideband Code Division Multiplex), EDGE (Enhanced Data Rates for GSM (Global System for Mobile communication) Evolution), GPRS (General Packet Radio Service), CDMA2000 (Code Division Multiple Access 2000), or any other current or future wireless network, as long as the principles described hereinafter are applicable.

The radio network node 1 is connected to the core network 3 for connectivity to central functions and a wide area network 7, such as the Internet.

Figure 2A:
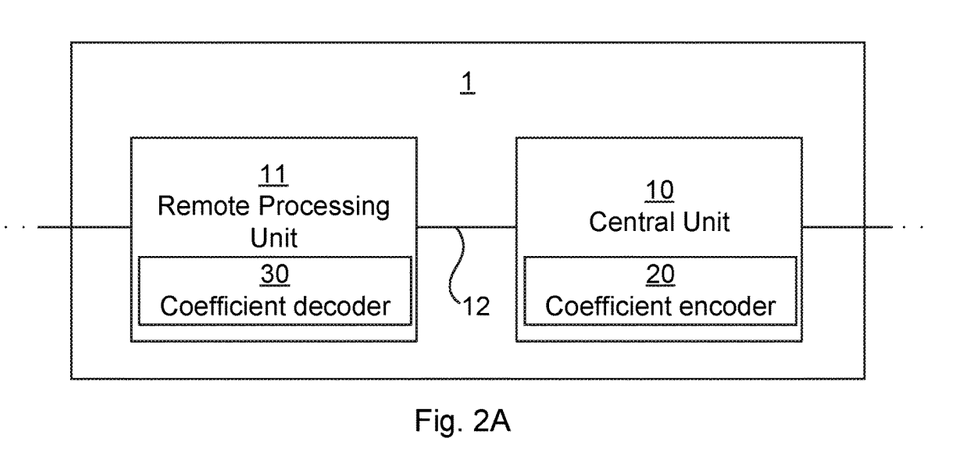
FIGS. 2A-B are schematic diagrams illustrating how the radio network node is implemented in a distributed fashion according to one embodiment.
Figure 2B:
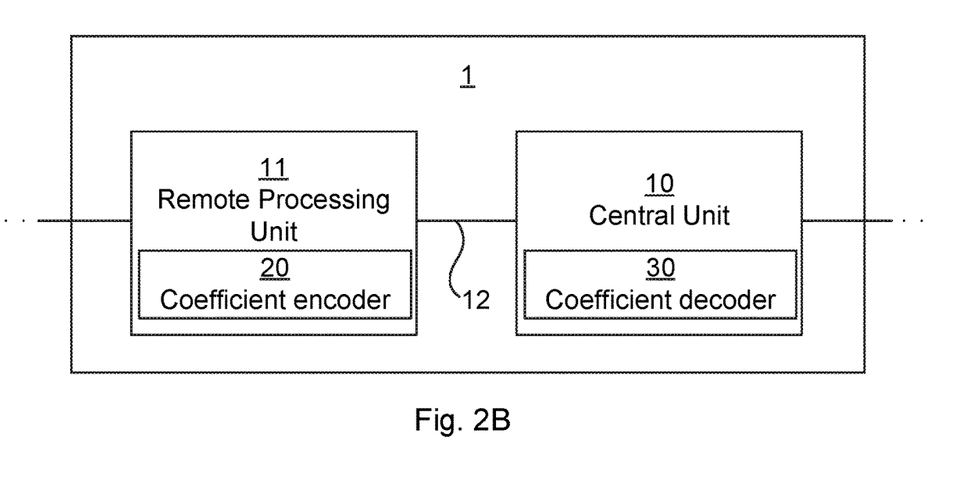

FIGS. 2A-B are schematic diagrams illustrating how the radio network node 1 is implemented in a distributed fashion according to one embodiment. First, the embodiment of FIG. 2A will be described. It is here disclosed a C-RAN (Centralised/Cloud Radio Access Network) architecture. The radio network node 1 here comprises a central unit 10 and a remote processing unit 11. The central unit 10 and the remote processing unit 11 can be in different locations. The central unit 10 is located uplink from the remote processing unit 11, i.e. towards the core network 3. Consequently, the remote processing unit 11 is located downlink from the central unit 10, towards the user device 2. There is a fronthaul link 12 between the central unit 10 and the remote processing unit 11. The fronthaul link 12 is a bidirectional communication link. The fronthaul link 12 can be implemented using a so-called C2 interface. It is to be noted that one physical device optionally implements central units 10 for multiple remote processing units 11.

The central unit 10 determines beamforming coefficients specific for each user device. The beamforming coefficients need to be applied by the remote processing unit. Hence, the beamforming coefficients are transmitted over the fronthaul link 12 to the remote processing unit 11. According to embodiments presented herein, presented below, the beamforming coefficients are efficiently compressed to reduce load on the fronthaul link 12.

The central unit 10 comprises a coefficient encoder 20 for compressing the beamforming coefficients and the remote processing unit 11 comprises a coefficient decoder 30 for decompressing the beamforming coefficients. Hence, the central unit 10 is a host device for the coefficient encoder 20 and the remote processing unit 11 is a host device for the coefficient decoder 30. The coefficient encoder 20 is used for compressing beamforming coefficients to be transported to the remote processing unit 11 over the fronthaul link 12. The coefficient decoder 30 decompresses the compressed beamforming coefficients received over the fronthaul link 12.

Looking now to FIG. 2B, an alternative embodiment is shown where beamforming coefficients are communicated from the remote processing unit 11 to the central unit 10. In such a situation, as illustrated in FIG. 2B, the remote processing unit 11 comprises the coefficient encoder 20 and the central unit 10 comprises the coefficient decoder 30.

Figure 3A:
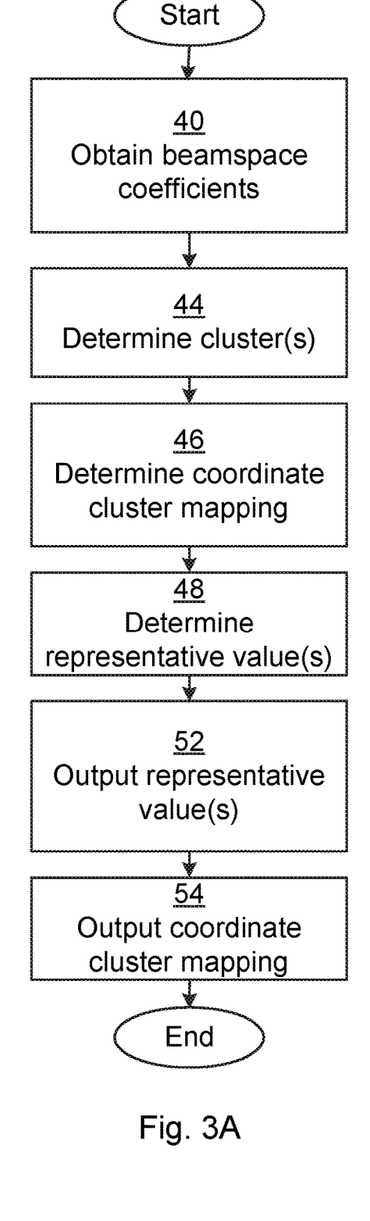
FIGS. 3A-B are flow charts illustrating embodiments of methods for compressing beamspace coefficients to be applied when transferring data between a radio network node and a specific user device.
Figure 3B:
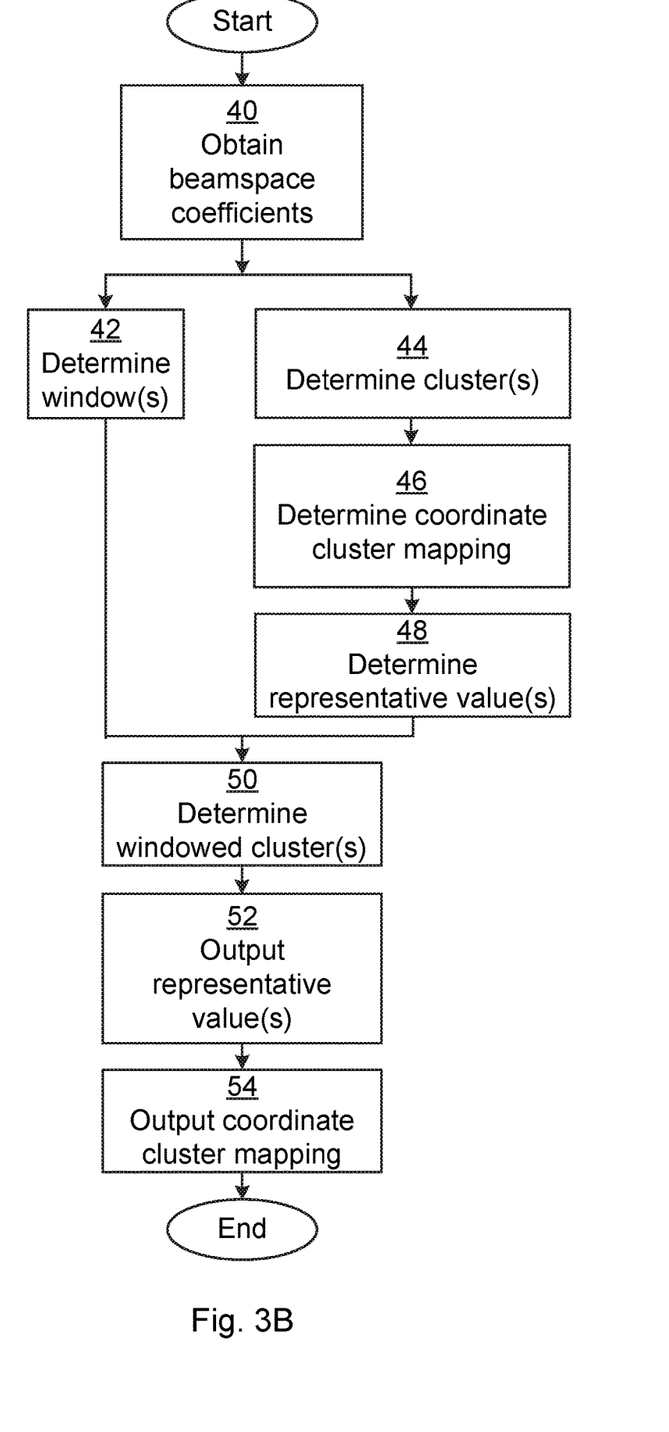

FIGS. 3A-B are flow charts illustrating embodiments of methods for compressing beamspace coefficients to be applied when transferring data between a radio network node and a specific user device. The methods are performed in a coefficient encoder. First, the flow chart of FIG. 3A will be described.

In an obtain beamspace coefficients step 40, beamspace coefficients are obtained. Each beamspace coefficient comprises a complex value and a direction. As indicated by the name, the beamspace coefficients are in beamspace. The obtaining can occur by transforming beamforming coefficients (in antenna element space) to beamspace coefficients using a spatial transform, e.g. Discrete Fourier Transform (DFT) or Singular Value Decomposition (SVD). As used herein, beamspace coefficients are in the beamspace domain while beamforming coefficients are in the antenna element space domain, even though beamspace coefficients are also used to form beams. The beamforming coefficients, in turn, can be derived from channel estimations and channel state feedbacks (e.g. Channel State Information—CSI), as known in the art per se.

Alternatively, the beamspace coefficients can be obtained from another entity. For instance, baseband processing could occur entirely in the beamspace domain.

The beamspace coefficients can be represented by a beamspace vector $W_{beam\_space}$ of size $N_{ant}$, where $N_{ant}$ represents the number of antenna elements.

In a determine cluster(s) step 44, at least one cluster is determined based on proximity, in a complex plane, of the complex values of the beamspace coefficients. In other words, beamspace coefficients which have complex values close to each other in the complex plane form part of the same cluster. Optionally, additional criteria can be applied, such as more radio-centric metrics like the resulting antenna pattern or machine learning features such as SVM (Support Vector Machine) or SVC (Support Vector Clustering).

Hence, the $W_{beam\_space}$ elements are grouped into $N_c$ clusters by distance similarity in the complex plane, where $N_c$ represents the number of clusters. Any suitable grouping and/or clustering algorithms can be applied, e.g. k-means or k-medoids algorithms.

In one embodiment, only beamspace coefficients within the at least one beam window are considered when the clusters are determined.

In a determine coordinate cluster mapping step 46, which is performed for each beamspace coefficient, it is determined a cluster to which each beamspace coefficient belongs. In practice, this step can be performed in combination with the determine cluster(s) step 44.

In a determine representative value(s) step 48, a representative complex value is determined for each one of the at least one cluster.

The representative value is a complex value that is associated with a single cluster.

In one embodiment, it is determined, for each cluster, the respective representative complex value to be in the centre of the cluster.

In one embodiment, it is determined, for each cluster, the respective representative complex value to be the beamspace coefficient which is closest to the centre of the cluster. Each cluster has one representative value.

In an output representative value(s) step 52, the respective representative complex values for each cluster are output.

In an output coordinate cluster mapping step 54, the coefficient encoder outputs, for each beamspace coefficient, an identity of the cluster to which the beamspace coefficient belongs. This information is obtained in the determine coordinate cluster mapping step 46. Hence, each element (i.e. beamspace coordinate) of the $W_{beam\_space}$ vector is approximated by the representative value of the cluster to which the element belongs.

Looking now to FIG. 3B, only new or modified steps compared to the steps of FIG. 3A will be described.

In a determine window(s) step 42, at least one beam window is determined. Each beam window covers a strict subset of the beamspace coefficients arranged by directions. The at least one beam window is determined based on magnitudes of the beamspace coefficients. In one embodiment, this comprises using a specified window size. This may comprise determining a specified number of windows.

Optionally, any overlapping windows are fused to a fused window. A central index for the fused window can be calculated as the average of the central indices of the individual overlapping windows.

In the determining of a window, a certain number of beamspace coefficients of greatest magnitude can be covered.

Putting this in another way, $N_w$ beam windows are defined over the beamspace vector $W_{beam\_space}$ (arranged by direction, see FIGS. 5C and 6C) based on the most powerful beam regions i.e., angular spread regions in space beam domain. The beam windows can be, but do not need to be, circular. A circular beam window wraps around the minimum and maximum limits of the directions. For instance if the directions are between 0 and 180 degrees. A circular window of 40 degrees starting at 170 degrees would wrap around to 30 degrees; i.e. this window would be made up of two sections from 170 to 180 degrees and from 0 to 30 degrees.

In general, antenna arrays present beam symmetry with regard to an antenna array plane. So, when signals depart or arrive at angles close to the array plane, the significant beams are concentrated at the beginning and at the end of the spatial spectrum. In these cases, a circular beam window that starts close to the end of the spatial spectrum and wraps around to the beginning is useful.

For an array of dipole antennas without a ground plane, the array plane is an axis of symmetry. This means that you cannot distinguish between front and back lobes. A beam pointing to +80 degrees (relative to array boresight) will thus also simultaneously point to 180-80=+120 degrees. But when a ground plane is added at a proper distance from the elements (e.g. a quarter of a wavelength), each element becomes more directive and the back lobes are attenuated.

It should be noted that the array symmetry does not cause wrap around in the spatial spectrum. A beam pointing to +80 degrees will not simultaneously point to -80 degrees. The reason why we see some wrap around effect in the spatial spectrum is spectral leakage in the spatial transform. For example, a beamforming scheme where all elements have constant magnitude weights and only the phase is adjusted to change beam direction, corresponds to a rectangular window over the elements. Thus, a beam focusing on some direction becomes a sinc function in the spatial spectrum. The sidelobes of this sinc function will wrap around. Since the array is typically critically sampled in the spatial domain (element spacing approximately equal to wavelength/2), the wrap-around on one edge immediately shows up on the other side and cannot be suppressed by filtering. However, the level of the side lobes can be reduced by using amplitude tapering of the array (i.e. non-rectangular window) at the cost of a wider main lobe.

The central point of each window can then be determined by the index of the $1^{st}$, $2^{nd}$, ..., $(N_w)^{th}$ most powerful coefficients in $W_{beam\_space}$, respectively. The effective window size $N_{ew}$ is a configurable input parameter.

Each window uses a fraction $1/N_w$ of the effective window size $N_{ew}$.

In a determine windowed cluster(s) step 50, the coefficient encoder determines, for each cluster, whether there are any beamspace coefficients of the cluster having a direction within the at least one beam window (see also FIGS. 5C and 6C and corresponding text below). For such clusters, the cluster is a windowed cluster.

When the determine window(s) step 42 is performed, the output representative value(s) step 52 can comprise outputting the representative complex values only for each windowed cluster. In other words, the representative values for beamspace coefficients forming part of clusters which are not windowed are omitted.

Optionally, when the determine window(s) step 42 is performed, the output coordinate cluster mapping step 54 can comprise outputting, only for each beamspace coefficient forming part of a windowed cluster, an identity of the cluster to which it belongs.

Optionally, when the determine window(s) step 42 is performed, the output coordinate cluster mapping step 54 comprises outputting, only for each beamspace coefficient having a direction within one of the at least one beam window, an identity of the cluster to which the beamspace coefficient belongs.

The output values are quantized prior to being transmitted to the coefficient decoder of the remote processing unit (over the fronthaul link).

Figure 4A:
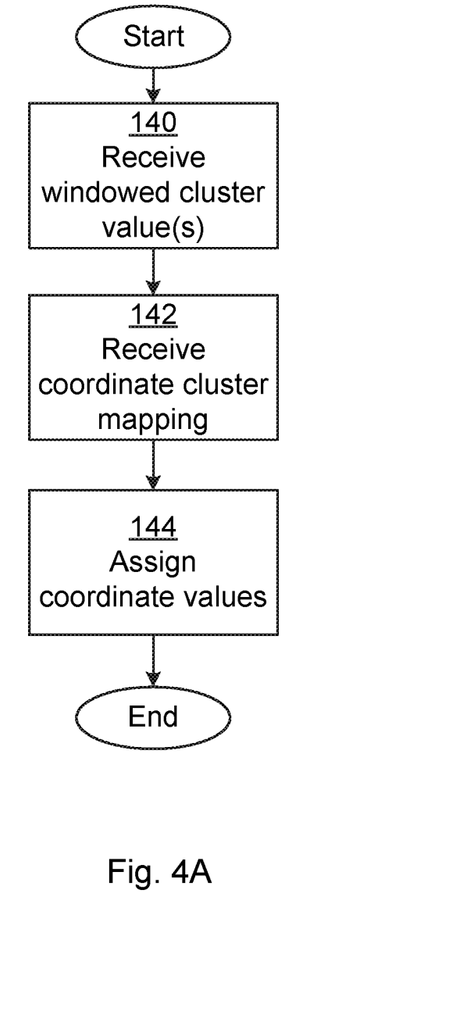
FIGS. 4A-B are flow charts illustrating embodiments of methods for decompressing beamspace coefficients to be applied when transferring data between a radio network node and a specific user device.
Figure 4B:
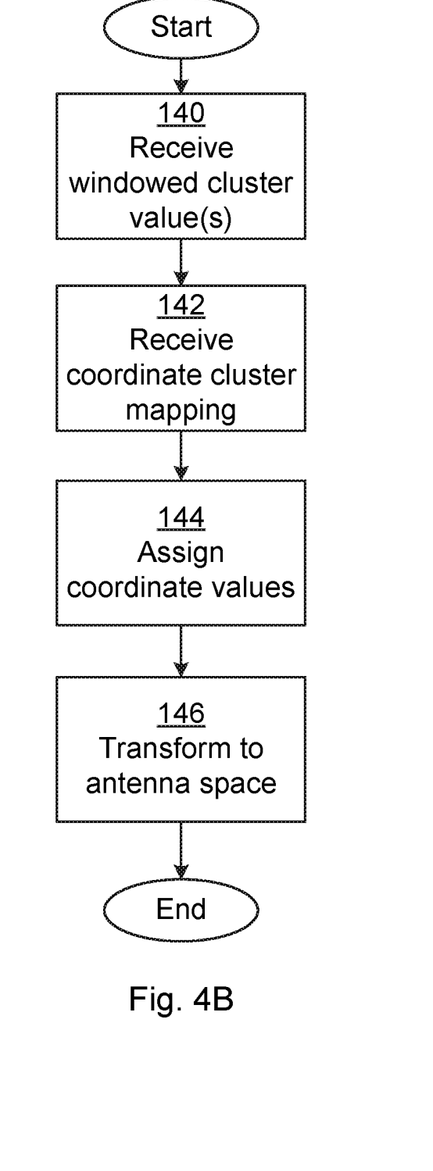

FIGS. 4A-B are flow charts illustrating embodiments of methods for decompressing beamspace coefficients to be applied when transferring data between a radio network node and a specific user device. The methods are performed in a coefficient decoder.

In a receive windowed cluster value(s) step 140, at least one representative complex value is received. Each representative complex value is associated with a respective cluster. The at least one representative complex value is received over the fronthaul link (12 of FIGS. 2A-B).

In a receive coordinate cluster mapping step 142, the coefficient decoder receives, for each one of a plurality of beamspace coefficients, a direction and an identity of the cluster to which it belongs. The directions and identities are received over the fronthaul link (12 of FIGS. 2A-B).

In an assign coordinate values step 144, the coefficient decoder assigns, for each one of the beamspace coefficients, the representative complex value of its respectively associated cluster.

Looking now to FIG. 4B, only new or modified steps compared to the steps of FIG. 4A will be described.

In a transform antenna space step 146, the coefficient decoder transforms the beamspace coefficients into antenna element space using an inverse spatial transform, e.g. Inverse DFT (IDFT).

Using embodiments of methods presented herein, beamforming coefficients are effectively compressed by grouping their values into clusters and optionally omitting smaller values using directional windowing. In this way, so called massive beamforming, with a great number of antennas (e.g. 128 or 256) can be supported without drowning the fronthaul link with coefficient traffic. Moreover, embodiments presented herein can be extended/scaled for wireless systems with an arbitrary number of antenna elements. Also, the method can be dynamically parametrized to adjust the trade-off between SINR (Signal to Interference plus Noise Ratio) performance and the required rate for BF coefficient transmission. For instance, increasing the number of clusters reduces approximation error but at the cost of more bits to index each cluster. The reverse holds equally true. Similarly, more windows can be applied to reduce the number of omitted coefficients, which improves accuracy but reduces compression. Moreover, window size can be adjusted.

There may be a situation where a greater number, but smaller, windows better covers the coefficients with large magnitude while omitting the same number, or even more, coefficients outside the windows.

FIGS. 5A-D are schematic graphs illustrating a first scenario of beamforming coefficients and how these are encoded according to one embodiment.

This scenario will now be explained with reference to the steps of the flow charts of FIGS. 3A-B.

Figure 5A:
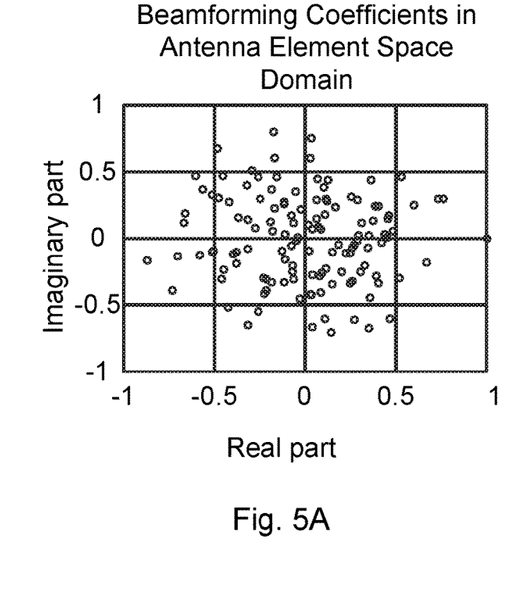
FIGS. 5A-D are schematic graphs illustrating a first scenario of beamforming coefficients and how these are encoded according to one embodiment.
Figure 5B:
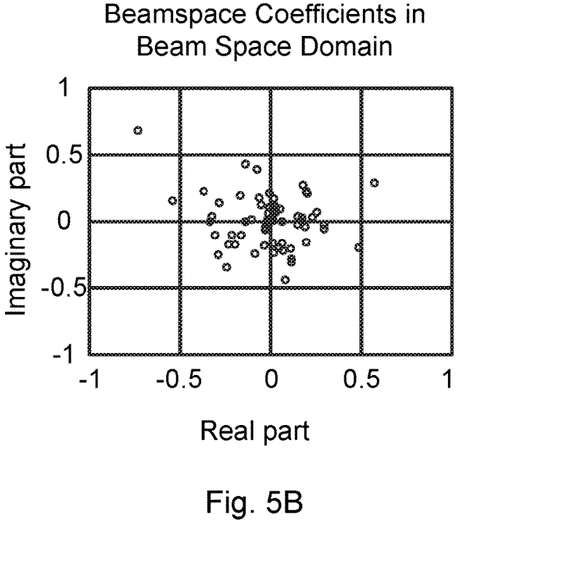

Looking first to FIG. 5A, the complex values of the beamforming coefficients are plotted in an antenna element space domain. Looking to FIG. 5B, this is a representation of the complex values of the beamforming coefficients of FIG. 5A after a transformation (e.g. using DFT) to beamspace. In beamspace, each coefficient represents a particular direction and has a complex value. The direction of each coefficient is not seen in FIG. 5B. In FIG. 5C, however, the beamspace coefficients of FIG. 5B are instead plotted along an x-axis representing direction, as an angle from antenna boresight in degrees. Array boresight is a direction perpendicular to the antenna array. The y-axis represents the (normalised) magnitude of each beamspace coefficient. The magnitude of each beamspace coefficient can be seen in FIG. 5B as its distance from the origin. The dashed rectangles in FIG. 5C represent the determined windows (see step 42).

Figure 5C:
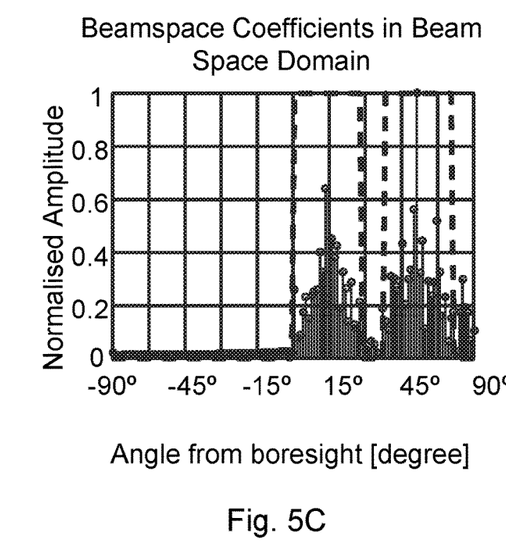
Figure 5D:
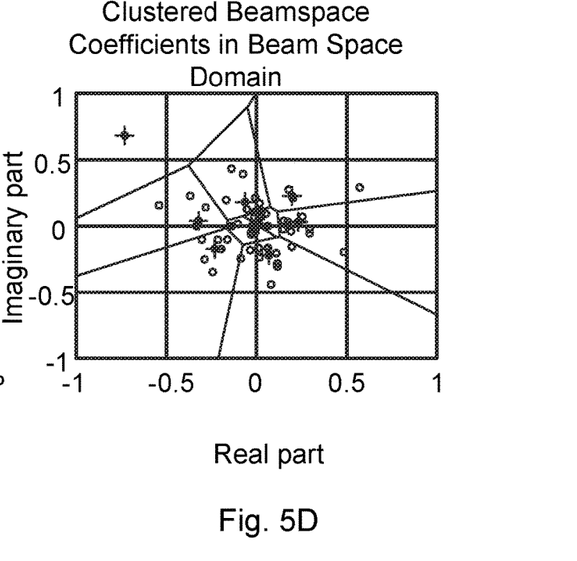

In FIG. 5D, the beamspace coefficients of FIG. 5B have been divided into clusters (see step 44). Each cluster has a representative value (see step 48), illustrated by a cross in FIG. 5D. Each window of FIG. 5C contains a number of coefficients which can come from different clusters. In other words, the coefficients of each cluster can be spread across very different directions.

Using embodiments presented, compression of the beamspace coefficients can occur in several ways.

Firstly, by approximating the value of each beamspace coefficient value in FIG. 5D with the representative value of the cluster, only the mapping between each beamspace direction and the cluster is needed, effectively reducing the number of bits per beamspace coefficient. In other words, the complex values of each beamspace coefficient are disposed of and replaced with the mapping to its cluster. Hence, only the number of bits required to distinguish between clusters is needed instead of the complex value for each beamspace coefficient.

Secondly and optionally, using the windows illustrated in FIG. 5C, directional regions containing beamspace coefficients of low magnitude are omitted, which reduces the number of beamspace coefficients to output.

Figure 6A:
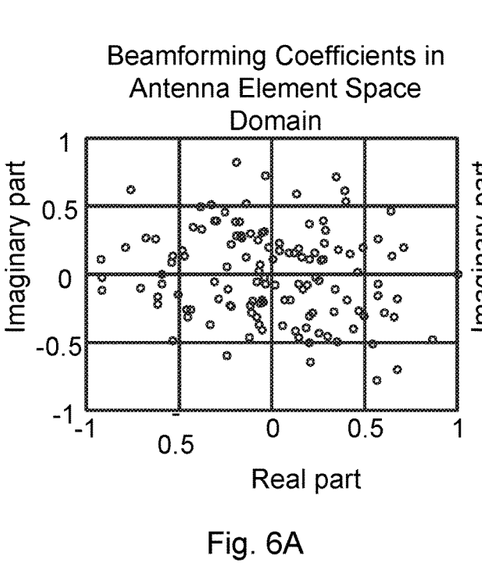
FIGS. 6A-D are schematic graphs illustrating a second scenario of beamforming coefficients and how these are encoded according to one embodiment.
Figure 6B:
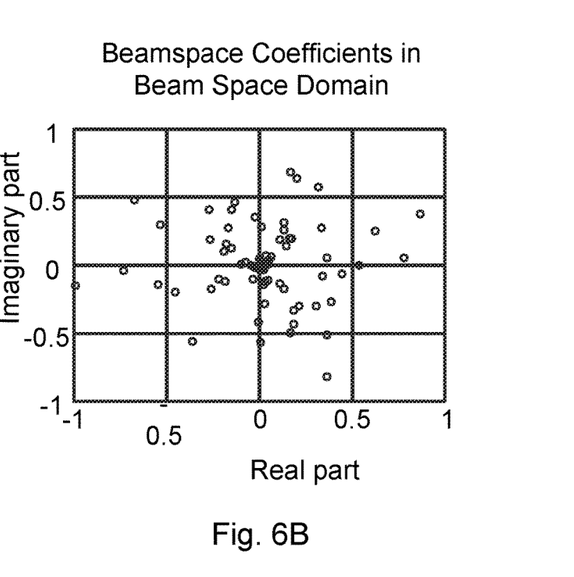

FIGS. 6A-D are schematic graphs illustrating a second scenario of another set of beamforming coefficients and how these are encoded according to one embodiment. FIG. 6A corresponds to FIG. 5A, FIG. 6B corresponds to FIG. 5B, FIG. 6C corresponds to FIG. 5C, and FIG. 6D corresponds to FIG. 5D, but for the second scenario.

Figure 6C:
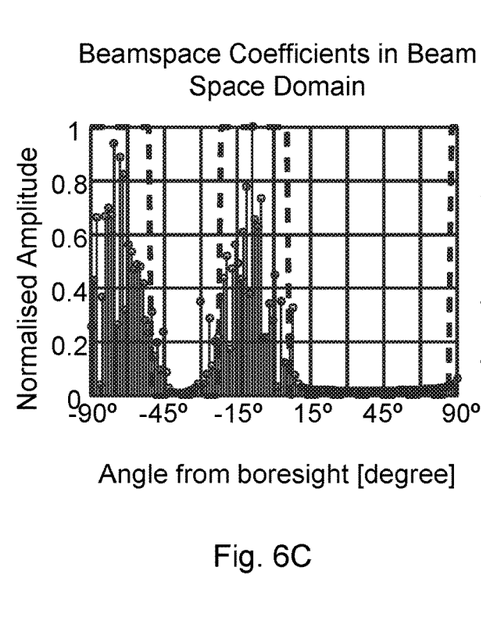
Figure 6D:
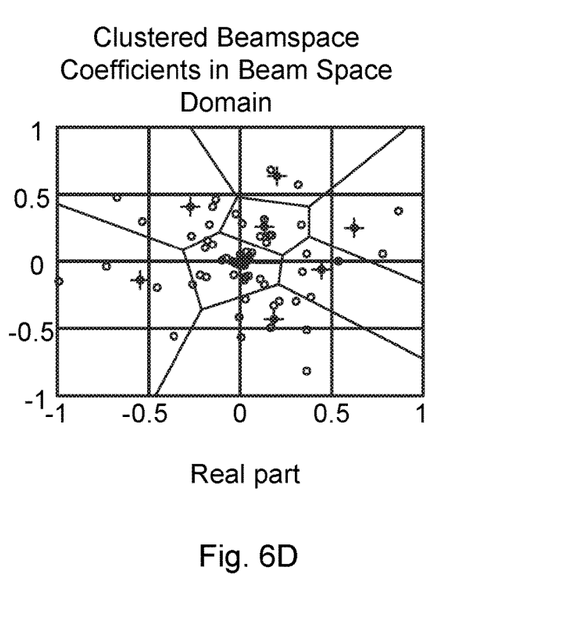

In this embodiment, the windows are circular windows; the circular windowing can be seen in FIG. 6C, where a window wraps around between −90 degrees and 90 degrees. Also, since the complex values of the beamforming coefficients are from another set than the set of beamforming coefficients of FIGS. 5A-D, the clustering shown in FIG. 6D differs from the clustering of FIG. 5D.

Figure 7:
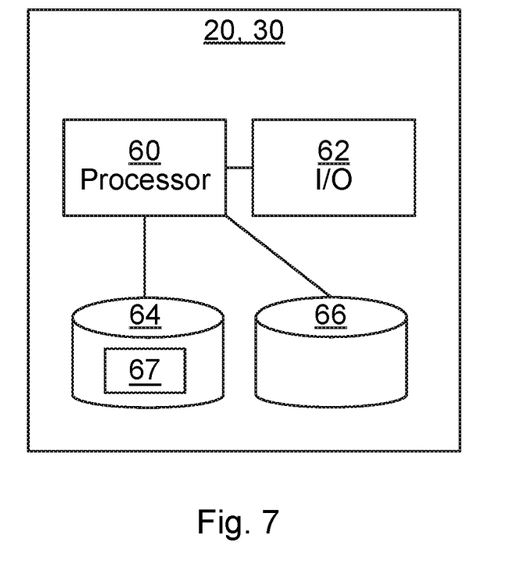
FIG. 7 is a schematic diagram illustrating components of each one of the coefficient encoder and the coefficient decoder of FIGS. 2A-B.

FIG. 7 is a schematic diagram illustrating components of each one of the coefficient encoder 20 and the coefficient decoder 30 of FIGS. 2A-B. It is to be noted that any of these components can be shared with a host device, e.g. the central unit 10 for the coefficient encoder 20, or the remote processing unit 11 of the coefficient decoder 30. A processor 60 is provided using any combination of one or more of a suitable central processing unit (CPU), multiprocessor, microcontroller, digital signal processor (DSP), application specific integrated circuit etc., capable of executing software instructions 67 stored in a memory 64, which can thus be a computer program product. The processor 60 can be configured to execute the method described with reference to FIGS. 3A-B and FIGS. 4A-B above.

The memory 64 can be any combination of read and write memory (RAM) and read only memory (ROM). The memory 64 also comprises persistent storage, which, for example, can be any single one or combination of magnetic memory, optical memory, solid state memory or even remotely mounted memory.

A data memory 66 is also provided for reading and/or storing data during execution of software instructions in the processor 60. The data memory 66 can be any combination of read and write memory (RAM) and read only memory (ROM).

The coefficient encoder 20 and the coefficient decoder 30 further comprise an I/O interface 62 for communicating with other external entities. Optionally, the I/O interface 62 also includes a user interface.

Other components of the coefficient encoder 20 and the coefficient decoder 30 are omitted in order not to obscure the concepts presented herein.

Figure 8:
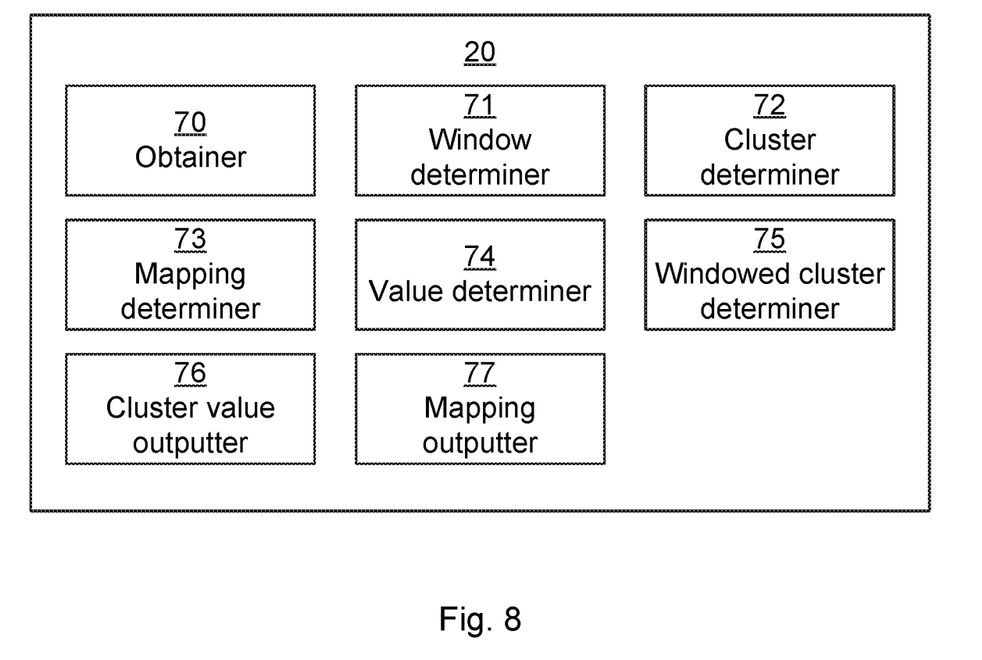
FIG. 8 is a schematic diagram showing functional modules of the coefficient encoder of FIGS. 2A-B according to one embodiment.

FIG. 8 is a schematic diagram showing functional modules of the coefficient encoder 20 of FIGS. 2A-B according to one embodiment. The modules are implemented using software instructions such as a computer program executing in the coefficient encoder 20. Alternatively or additionally, the modules are implemented using hardware, such as any one or more of an ASIC (Application Specific Integrated Circuit), an FPGA (Field Programmable Gate Array), or discrete logical circuits. The modules correspond to the steps in the methods illustrated in FIGS. 3A and 3B.

An obtainer 70 corresponds to step 40. A window determiner 71 corresponds to step 42. A cluster determiner 72 corresponds to step 44. A mapping determiner 73 corresponds to step 46. A value determiner 74 corresponds to step 48. A windowed cluster determiner 75 corresponds to step 50. A representative value outputter 76 corresponds to step 52. A mapping outputter 77 corresponds to step 54.

Figure 9:
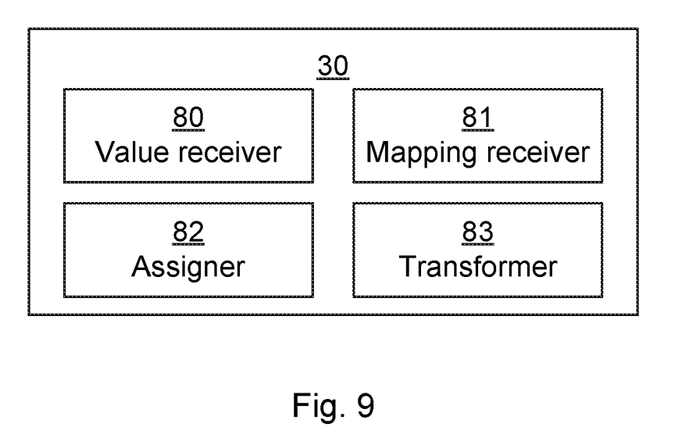
FIG. 9 is a schematic diagram showing functional modules of the coefficient decoder of FIGS. 2A-B according to one embodiment.

FIG. 9 is a schematic diagram showing functional modules of the coefficient decoder 30 of FIGS. 2A-B according to one embodiment. The modules are implemented using software instructions such as a computer program executing in the coefficient decoder 30. Alternatively or additionally, the modules are implemented using hardware, such as any one or more of an ASIC (Application Specific Integrated Circuit), an FPGA (Field Programmable Gate Array), or discrete logical circuits. The modules correspond to the steps in the methods illustrated in FIGS. 4A and 4B.

A value receiver 80 corresponds to step 140. A mapping receiver 81 corresponds to step 142. An assigner 82 corresponds to step 144. A transformer 83 corresponds to step 146.

Figure 10:
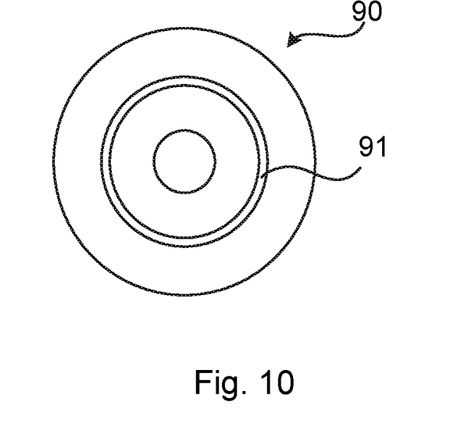
FIG. 10 shows one example of a computer program product comprising computer readable means.

FIG. 10 shows one example of a computer program product 90 comprising computer readable means. On this computer readable means a computer program 91 can be stored, which computer program can cause a processor to execute a method according to embodiments described herein. In this example, the computer program product is an optical disc, such as a CD (compact disc) or a DVD (digital versatile disc) or a Blu-Ray disc. As explained above, the computer program product could also be embodied in a memory of a device, such as the computer program product 64 of FIG. 7. While the computer program 91 is here schematically shown as a track on the depicted optical disk, the computer program can be stored in any way which is suitable for the computer program product, such as a removable solid state memory, e.g. a Universal Serial Bus (USB) drive.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A method for compressing beamspace coefficients to be applied when transferring data between a radio network node and a specific user device, the method being performed in a coefficient encoder and comprising the steps of:
   obtaining beamspace coefficients, wherein each beamspace coefficient comprises a complex value and a direction;
   determining at least one cluster based on proximity, in a complex plane, of the complex values of the beamspace coefficients;
   determining, for each beamspace coefficient, a cluster to which it belongs;
   determining a representative complex value for each one of the at least one cluster;
   outputting the representative complex values for each cluster; and
   outputting, for each beamspace coefficient, an identity of the cluster to which the beamspace coefficient belongs.

2. The method according to claim 1, further comprising the steps of:
   determining at least one beam window, wherein each beam window covers a strict subset of the beamspace coefficients arranged by directions, wherein the at least one beam window is determined based on magnitudes of the beamspace coefficients;
   determining, for each cluster, whether there are any beamspace coefficients of the cluster having a direction within the at least one beam window, in which case the cluster in question is a windowed cluster;
   and wherein the step of outputting the representative complex values comprises outputting the representative complex values only for each windowed cluster; and
   wherein the step of outputting the identity comprises outputting, only for each beamspace coefficient forming part of the windowed cluster, an identity of the cluster to which it belongs.

3. The method according to claim 2, wherein the step of determining at least one beam window comprises using a specified window size.

4. The method according to claim 2, wherein the step of determining at least one beam window comprises determining a specified number of windows.

5. The method according to claim 2, wherein the step of determining at least one beam window comprises fusing any overlapping windows to a fused window.

6. The method according to claim 2, wherein the step of determining at least one beam window comprises covering beamspace coefficients of greatest magnitude.

7. The method according to claim 2, wherein the step of determining at least one cluster only considers beamspace coefficients within the at least one beam window.

8. The method according to claim 2, wherein the step of outputting the identity comprises outputting, only for each beamspace coefficient having a direction within one of the at least one beam window, an identity of the cluster to which the beamspace coefficient belongs.

9. The method according to claim 1, wherein the step of obtaining the beamspace coefficients comprises transforming beamforming coefficients to beamspace coefficients using a spatial transform.

10. The method according to claim 1, wherein the step of determining the representative complex value comprises determining, for each cluster, a respective representative complex value to be in the center of the cluster.

11. The method according to claim 1, wherein the step of determining the representative complex value comprises determining, for each cluster, a respective representative complex value to be the beamspace coefficient which is closest to the center of the cluster.

12. A coefficient encoder for compressing beamspace coefficients to be applied when transferring data between a radio network node and a specific user device, the coefficient encoder comprising:
   a processor; and
   a memory storing instructions that, when executed by the processor, cause the coefficient encoder to:
      obtain beamspace coefficients, wherein each beamspace coefficient comprises a complex value and a direction;
      determine at least one cluster based on proximity, in a complex plane, of the complex values of the beamspace coefficients;
      determine, for each beamspace coefficient, a cluster to which it belongs;
      determine a representative complex value for each one of the at least one cluster;
      output the representative complex values for each cluster; and
      output, for each beamspace coefficient, an identity of the cluster to which the beamspace coefficient belongs.

13. The coefficient encoder according to claim 12, further instructions that, when executed by the processor, cause the coefficient encoder to:
   determine at least one beam window, wherein each beam window covers a strict subset of the beamspace coefficients arranged by directions, wherein the at least one beam window is determined based on magnitudes of the beamspace coefficients;
   determine, for each cluster, whether there are any beamspace coefficients of the cluster having a direction within the at least one beam window, in which case the cluster in question is a windowed cluster;
   and wherein the instructions to output the representative complex values comprise instructions that, when executed by the processor, cause the coefficient encoder to output the representative complex values only for each windowed cluster; and wherein the instructions to output the identity comprise instructions that, when executed by the processor, cause the coefficient encoder to output, only for each beamspace coefficient forming part of the windowed cluster, an identity of the cluster to which it belongs.

14. The coefficient encoder according to claim 13, wherein the instructions to determine at least one beam window comprise instructions that, when executed by the processor, cause the coefficient encoder to use a specified window size.

15. The coefficient encoder according to claim 13, wherein the instructions to determine at least one beam window comprise instructions that, when executed by the processor, cause the coefficient encoder to determine a specified number of windows.

16. The coefficient encoder according to claim 13, wherein the instructions to determine at least one beam window comprise instructions that, when executed by the processor, cause the coefficient encoder to fuse any overlapping windows to a fused window.

17. The coefficient encoder according to claim 13, wherein the instructions to determine at least one beam window comprise instructions that, when executed by the processor, cause the coefficient encoder to cover beamspace coefficients of greatest magnitude.

18. The coefficient encoder according to claim 13, wherein the instructions to determine at least one cluster comprise instructions that, when executed by the processor, cause the coefficient encoder to only consider beamspace coefficients within the at least one beam window when determining the at least one cluster.

19. The coefficient encoder according to claim 13, wherein the instructions to output the identity comprise instructions that, when executed by the processor, cause the coefficient encoder to output, only for each beamspace coefficient having a direction within one of the at least one beam window, an identity of the cluster to which the beamspace coefficient belongs.

20. The coefficient encoder according to claim 12, wherein the instructions to obtain the beamspace coefficients comprise instructions that, when executed by the processor, cause the coefficient encoder to transform beamforming coefficients to beamspace coefficients using a spatial transform.

21. The coefficient encoder according to claim 12, wherein the instructions to determine the representative complex value comprise instructions that, when executed by the processor, cause the coefficient encoder to determine, for each cluster, a respective representative complex value to be in the center of the cluster.

22. The coefficient encoder according to claim 12, wherein the instructions to determine the representative complex value comprise instructions that, when executed by the processor, cause the coefficient encoder to determine, for each cluster, a respective representative complex value to be the beamspace coefficient which is closest to the center of the cluster.

23. A coefficient encoder comprising:
means for obtaining beamspace coefficients to be applied when transferring data between a radio network node and a specific user device, wherein each beamspace coefficient comprises a complex value and a direction;
means for determining at least one cluster based on proximity, in a complex plane, of the complex values of the beamspace coefficients;
means for determining, for each beamspace coefficient, a cluster to which it belongs;
means for determining a representative complex value for each one of the at least one cluster;
means for outputting the representative complex values for each cluster; and
means for outputting, for each beamspace coefficient, an identity of the cluster to which the beamspace coefficient belongs.

24. A computer program stored on a non-transitory computer readable medium for compressing beamspace coefficients to be applied when transferring data between a radio network node and a specific user device, the computer program comprising computer program code which, when run on a coefficient encoder, causes the coefficient encoder, to:
obtain beamspace coefficients, wherein each beamspace coefficient comprises a complex value and a direction;
determine at least one cluster based on proximity, in a complex plane, of the complex values of the beamspace coefficients;
determine, for each beamspace coefficient, a cluster to which it belongs;
determine a representative complex value for each one of the at least one cluster;
output the representative complex values for each cluster; and
output, for each beamspace coefficient, an identity of the cluster to which the beamspace coefficient belongs.

25. A method for decompressing beamspace coefficients to be applied when transferring data between a radio network node and a specific user device, the method being performed in a coefficient decoder and comprising the steps of:
receiving at least one representative complex value, wherein each representative complex value is associated with a respective cluster;
receiving, for each one of a plurality of beamspace coefficients, a direction for each one of the plurality of beamspace coefficients and an identity of the cluster to which it belongs; and
assigning, for each one of the beamspace coefficients, the representative complex value of its respectively associated cluster.

26. The method according to claim 25, further comprising a step of transforming the beamspace coefficients into antenna element space using an inverse spatial transform.

27. A coefficient decoder for decompressing beamspace coefficients to be applied when transferring data between a radio network node and a specific user device, the coefficient decoder comprising:
a processor; and
a memory storing instructions that, when executed by the processor, cause the coefficient decoder to:
receive at least one representative complex value, wherein each representative complex value is associated with a respective cluster;
receive, for each one of a plurality of beamspace coefficients, a direction for each one of the plurality of beamspace coefficients and an identity of the cluster to which it belongs; and
assign, for each one of the beamspace coefficients, the representative complex value of its respectively associated cluster.

28. The coefficient decoder according to claim 27, further comprising instructions that, when executed by the processor, cause the coefficient decoder to transform the beamspace coefficients into antenna element space using an inverse spatial transform.

29. A coefficient decoder comprising:
- means for receiving at least one representative complex value, wherein each representative complex value is associated with a respective cluster;
- means for receiving, for each one of a plurality of beamspace coefficients to be applied when transferring data between a radio network node and a specific user device, a direction for each one of the plurality of beamspace coefficients and an identity of the cluster to which it belongs; and
- means for assigning, for each one of the beamspace coefficients, the representative complex value of its respectively associated cluster.

30. A computer program stored on a non-transitory computer readable medium for decompressing beamspace coefficients to be applied when transferring data between a radio network node and a specific user device, the computer program comprising computer program code which, when run on a coefficient decoder causes the coefficient decoder to:
- receive at least one representative complex value, wherein each representative complex value is associated with a respective cluster;
- receive, for each one of a plurality of beamspace coefficients, a direction for each one of the plurality of beamspace coefficients and an identity of the cluster to which it belongs; and
- assign, for each one of the beamspace coefficients, the representative complex value of its respectively associated cluster.

* * * * *